United States Patent [19]

Yamazaki

[11] Patent Number: 5,079,222
[45] Date of Patent: Jan. 7, 1992

[54] SUPERCONDUCTING CERAMIC CIRCUITS AND MANUFACTURING METHOD FOR THE SAME

[75] Inventor: Shunpei Yamazaki, Tokyo, Japan

[73] Assignee: Semiconductor Energy Laboratory Co., Ltd., Kanagawa, Japan

[21] Appl. No.: 236,925

[22] Filed: Aug. 26, 1988

[30] Foreign Application Priority Data

| Aug. 31, 1987 | [JP] | Japan | 62-218538 |
| Aug. 31, 1987 | [JP] | Japan | 62-218539 |
| Sep. 6, 1987 | [JP] | Japan | 62-222622 |
| Sep. 6, 1987 | [JP] | Japan | 62-222623 |

[51] Int. Cl.$^5$ ............................................... B32B 9/00
[52] U.S. Cl. ............................................. 505/1; 505/701; 505/702; 505/703; 505/704; 428/209; 428/210; 428/426; 428/432; 428/433; 428/688; 428/901; 428/930; 174/250; 361/397
[58] Field of Search ............... 505/1, 701.4; 428/209, 428/210, 426, 432, 433, 688, 901, 930; 174/68.5; 361/397

[56] References Cited

U.S. PATENT DOCUMENTS 4,894,612  1/1990  Drake et al. ........................ 505/1

FOREIGN PATENT DOCUMENTS 300594  12/1988  Japan .
1134996  5/1989  Japan .
1134997  5/1989  Japan .

OTHER PUBLICATIONS

Multilayer Ceramic Circuit Boards-from copper conductors to superconductors, Imanaka et al, Fujitsu, vol. 39, No. 3, pp. 137–43 (1988).

*Primary Examiner*—Patrick J. Ryan
*Attorney, Agent, or Firm*—Sixbey, Friedman, Leedom & Ferguson

[57] ABSTRACT

A superconducting pattern formed from a superconducting ceramic film is illustrated. The pattern is made in the form of a coil which is embeded in an insulating ceramic film. The insulating film is made of a ceramic material whose termal expansion coefficient is approximately equal to that of the coil.

16 Claims, 2 Drawing Sheets

SUPERCONDUCTING CERAMIC CIRCUITS AND MANUFACTURING METHOD FOR THE SAME

BACKGROUND OF THE INVENTION

This invention relates to superconducting ceramic circuits and manufacturing methods for the same.

It has been known to use metallic materials such as $Nb_3Ge$ to wind a coil to form a superconducting magnet having a high Tc since a metallic material has a high ductility and a high malleability. In recent years, superconducting ceramics which have a high Tc are attracting interest of researchers.

However, such superconducting ceramics are fragile because of low ductility and malleability so that it is quite impossible to form a superconducting coil with a wire made of such superconducting ceramics.

SUMMARY OF THE INVENTION

It is therefore an object of the invention to provide a high Tc superconductor in the form of wires or strips with high reliability.

It is therefore an object of the invention to provide a method of manufacturing high Tc superconductors in the form of wires for strips which is suitable for mass-production with a high yield.

In accordance with the present invention, an oxide mixture for constituting a superconducting ceramic is deposited in the form of a thin film on a substrate, e.g. by sputtering such as magnetron sputtering, printing such as screen press printing, spraying such as plasma spraying, electron beam evaporation or other methods. The deposited ceramic film is then fired at 500°–1000° C., e.g. 900° C. for 15 hours. After gradually cooling at a rate of 200° C./min or slower, e.g. 10° C./min, the ceramic film is further oxidized at 450° C. for an hour, if necessary. During the deposition, firing and oxidizing, a magnetic field may be applied to the deposited film in order to expedite the formation of crystalline structure. The superconducting film is irradiated and scanned with a laser beam along a prescribed pattern in order to remove the film partly. Examples of lasers for this use are YAG lasers (1.06 microns), eximer lasers (KrF or KrCl), argon lasers, and nitrogen lasers. YAG lasers can emit infrared laser pulses having a circular cross section at 5–100 KHz. The pulse width of YAG lasers is not shorter than 50 nm, and therefore, if fine control of processing depths of laser scribing is desired, eximer lasers are suitable for this application because the pulse width is as short as 20 microns. By focussing with an optical system, excimer laser beams can be squeezed to a diameter of 10–100 microns. A representative pattern is spirals in the form of superconducting coils. The superconducting pattern on the substrate is covered with an insulating coating. It is important to make the insulating coating from a material whose thermal expansion coefficient is approximately equal to that of the superconducting pattern. The insulating coating is non-superconducting and preferably made of a ceramic material similar to the material forming the superconducting pattern. A portion of the insulating coating just above the end of the superconducting coil is removed to provide an opening. Then, another superconducting ceramic film is superimposed on the insulating film and patterned into an upper spiral form in order to be coupled with the lower superconducting coil through the opening. The windings of the upper and lower spirals have to be in opposite directions so that the inductances are summed rather than cancelled out.

Preferred examples of the insulating films used in contact with the superconducting pattern are represented by the stoichiometric formula, referred to "non-superconducting ceramics" hereinafter, $[(A'_pA''_{1-p})_{1-x}(B'_qB''_{1-q})_x]_y(CU_rX_{1-r})_zO_w$, where A' is one or more elements of Group IIIa of the Priodic Table, e.g., the rare earth elements or lantanoides, B' is one or more alkaline earth metals, i.e. Ba, Sr and Ca, A'', B'' and X are selected from a group consisting of Mg, Be, Al, Fe, Co, Ni, Cr, Ti, Mn and Zr, and $x=0.1-1$; $y=2.0-4.0$, preferably 2.5–3.5; $Z=1.0-4.0$, preferably 1.5–3.5; and $w=4.0-10.0$, preferably 6.0–8.0. The numbers p, q and r are chosen to be 0.99 to 0.80 so that the total proportion of A'', B'' and X is 1–20 vol % in the ceramic material, particularly in case of Mg and Al, the proportion may be 1–5 %.

Preferred examples of the superconducting ceramic materials used in accordance with the present invention for forming coils or other patterns are represented by the stoichiometric formula, $(A_{1-x}B_x)_yCu_zO_w$, where A is one or more elements of Group IIIa of the Priodic Table, e.g., the rare earth elements or lantanoides, B is one or more alkaline earth metals, i.e. Ba, Sr and Ca, and $x=0-1$; $y=2.0-4.0$, preferably 2.5–3.5; $z=1.0-4.0$, preferably 1.5–3.5; and $w=4.0-10.0$, preferably 6.0–8.0.

The non-superconducting ceramic film and the superconducting ceramic film can be formed by spraying method for example. Namely, nitrates, hidrochlorides, and/or oxalate of the elements are dissolved in water and nutralized by ammonia in order to produce extremely fine particles. These fine particles are coated on a surface, dried and fired in an oxidizing atmosphere such as an excited oxygen atmosphere. This firing process can be carried out at relatively low temperatures by making use of an $O_3$ atmosphere.

BRIEF DESCRIPTION OF THE INVENTION

DETAILED DESCRIPTION OF THE PREFERRED EMBODIMENTS

Figure 1A:
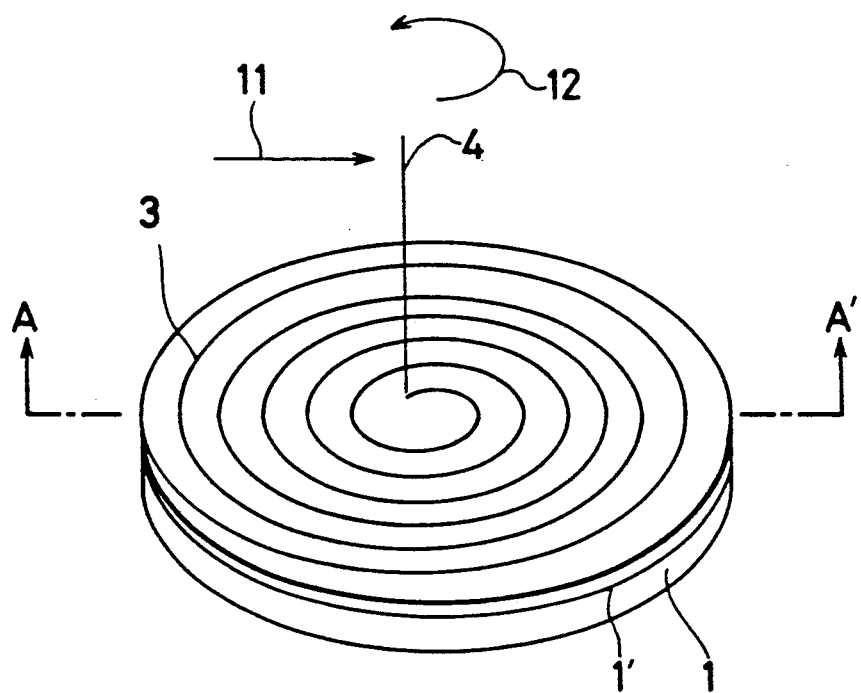
FIG. 1(A) is a perspective view showing the manufacturing process of a superconducting coil in accordance with the present invention.
Figure 1B:
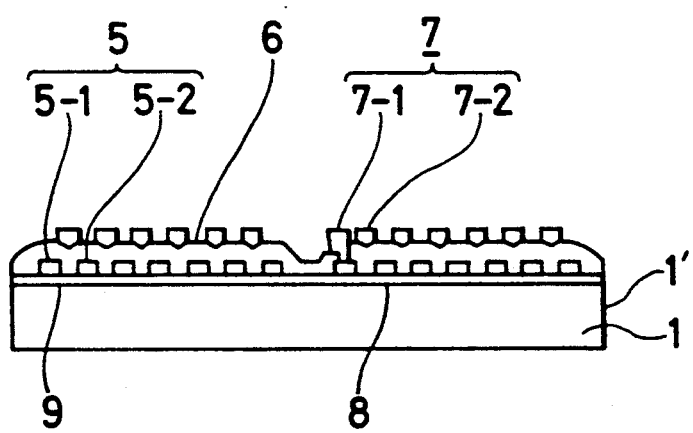
FIG. 1(B) is a cross section view showing the superconducting coil in FIG. 1(A).

Referring to FIGS. 1(A) and (B), a superconducting coil in accordance with the present invention is illustrated. A circular substrate 1 is made of a caramic material such as alumina, silicon oxide, alminium nitride, zirconia, yttria or YSZ(yttria stabilized zircon), or a metal or a quartz glass. YSZ, yttria or zirconia are particularly suitable having regard to the desirability of matching the coefficient of thermal expansion rate of the substrate to that of the superconducting film formed thereon as hereinafter described. The differential coefficient of thermal expansion between the underlying substrate and the overlying ceramic thin film to cover them should be as small as possible preferably within 50 % of the ceramic thin film. If the substrate and the ceramic thin film have substantially different thermal coefficients, strain developed between them may hinder the formation of superconducting structure by recrystallization of the ceramic films. The surface of the substrate can be coated with a "non-superconducting ceramic" material.

Prescribed amounts of oxides, carbonate and/or halides are mixed together in a ball mill, compacted and fired. The fired mixture is deposited on the substrate 1 at a substrate temperature of 650° C. to a thickness of 0.1 to 50 microns, e.g. 20 microns by magnetoron sputtering using a target of the fired mixture in an oxygen atmosphere containing 20% argon. The deposited film is annealed at 850° C. for 8 hours, gradually cooled at 4° C. per minute and annealed again at 400° C. for 2 hours. As a result, a superconducting structure of the ceramic which is sublimable is constructed with its (a,b) plane in parallel with the substrate.

Next, the surface of the superconducting film is scanned with irradiation of laser pulses from an eximer laser (254 nm) of 50 microns diameter along a spiral path while the circular substrate is turning. The laser pulse location is shifted from a peripheral position toward the center of the circular substrate to form the spiral. By virtue of the laser pulses, the irradiated portion of the superconducting film is removed by sublimation, and a spiral groove is formed so that a superconducting spiral pattern remains. The peak output level of the laser pulses is $10^6$ to $10^8$ W/sec. This laser scribing may be performed before the annealing of the ceramic film instead.

The superconducting spiral on the upper surface of the substrate is isolated by coating an insulating film made of a "non-superconducting ceramic". It is important that the insulating film is selected to have a thermal expansion coefficient approximately equal to that of the superconducting spiral. A portion of the insulating film is eliminated to form an opening in order to expose the inner end 8 of the superconducting spiral. A ceramic oxide film is deposited again on the structure, fired and patterned in the same manner to be an upper superconducting spiral. The upper superconducting ceramic spiral turns in the reverse direction to the lower superconducting ceramic spiral. Since the upper and lower spirals are coupled through the opening, a double-layered coil is constructed with a doubled inductance.

Figure 2A:
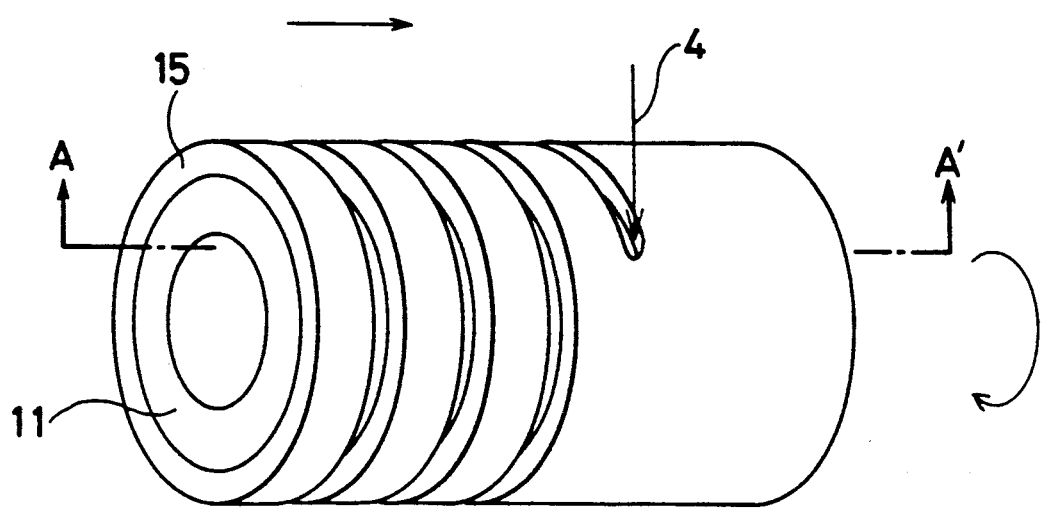
FIG. 2(A) is a perspective view showing the manufacturing process of another superconducting coil in accordance with the present invention.
Figure 2B:
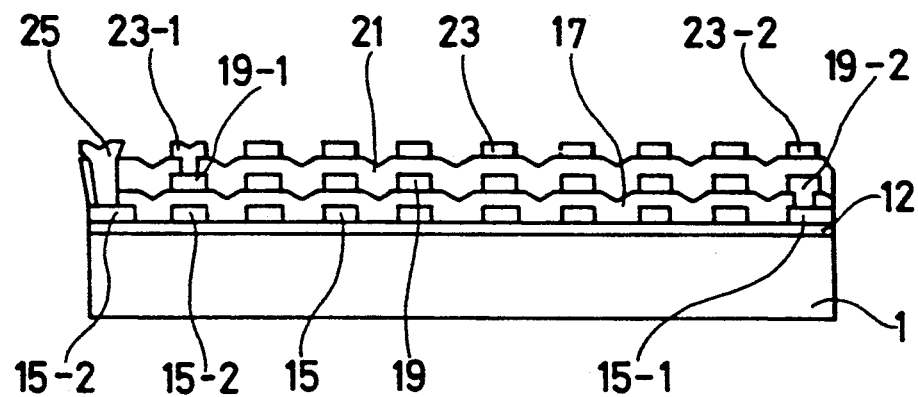
FIG. 2(B) is a cross section view showing the superconducting coil in FIG. 2(A).

Referring now to FIGS. 2(A) and 2(B), another embodiment of the present invention will be described. In this embodiment, equivalent procedure of the previous embodiment is carried out but on the surface of a cylinder 11. Deposition is performed on the cylindrical surface coated with a "non-superconducting ceramic" film 12 with the cylinder 11 turning. The path of laser pulses 4 is shifted toward the right direction on the left end of the turning cylinder as indicated by arrow. Accordingly, a herical groove 13 is formed on the film leaving a first superconducting helix 15. A first "non-superconducting ceramic" film 17 is formed with an opening at one end 15-1 of the first helix. A second superconducting helix 7 and a second "non-superconducting ceramic" film 21 with an opening at one end 19-1 of the second helix 7 are formed in the same manner. The other end 19-2 of the second helix is coupled with the first helix 15 through the opening of the first non-superconducting film 17. An opening is formed penetrating through the first and second non-superconducting films 17 and 21. Furthermore, a third superconducting helix 23 is formed in order that it is coupled at one end 23-1 thereof with the second superconducting helix 19 through the opening. Then, a triple-layered coil is formed. One terminal is the other end 23-2 of the third helix and the other terminal is the other end 15-2 of the first helix 2. The other terminal 15-2 is provided with a contact 25 making contact with the other end of the first helix through the opening at the other end 15-2.

While the foregoing description is directed to methods for making superconducting ceramic patterns carried on substrates, light weighted superconducting coils which are not supported by substrates can be also formed in accordance with the present invention. For this purpose, temporary substrates are prepared in the forms of the substrates 1 and 11 as illustrated in FIGS. 1(A) and 1(B) and FIGS. 2(A) and 2(B). The temporary substrates have to be made of materials which is soluble by a suitable solvent, e.g. organic substances, but compatible with "non-superconducting ceramics". On the temporary substrate, a non-superconducting ceramic film is formed to a thickness of 10–5000 microns, e.g. 20 microns for example. Thereafter, the procedures of the foregoing examples are repeated on the "non-superconducting ceramic" film in order to make a multi-layered spiral coil and a multi-layered helical coil. After the completion of the coils, the temporary substrates are removed with a solvent.

If a further increased large number of turns is desired, a further number of ceramic layers, e.g. several tens of ceramic layers, provided with spirals or helices respectively are formed.

Although the helices are connected in series in FIG. 2(B), the helices can be formed without interconnection therebetween, but the superconducting patterns on the ceramic layer can be desined to produce an indivisual pair of terminals for each helix so that the connection among the helices can be arbitrarily arranged.

Superconducting ceramics for use in accordance with the present invention also may be prepared in consistence with the stoichiometric formulae $(A_{1-x}B_x)_yCu_zO_w$, where A is one or more elements of Group IIIa of the Periodic Table, e.g., the alkaline earth metals elements, B is one or more elements of Group IIa of the Periodic Table, e.g., the alkaline earth metals including beryllium and magnesium, and x=0–1; y=2.0–4.0, preferably 2.5–3.5; z=1.0–4.0, preferably 1.5–3.5; and w=4.0–10.0, preferably 6.0–8.0. Also, superconducting ceramics for use in accordance with the present invention may be prepared consistent with the stoichiometric formulae $(A_{1-x}B_x)_yCu_zO_w$, where A is one or more elements of Group Vb of the Periodic Table such as Bi, Sb and As, B is one or more elements of Group IIa of the Periodic Table, e.g., the alkaline earth metals including beryllium and magnesium, and X=0.3–1; Y=2.0–4.0, preferably 2.5–3.5; Z=1.0–4.0, preferably 1.5–3.5; and W=4.0–10.0, preferably 6.0–8.0. Examples of this general formula are $BiSrCaCuCu_2O_X$ and $Bi_4Sr_3Ca_3Cu_4O_X$. Tc onset and Tco samples confirmed consistent with the formula $Bi_4Sr_YCa_3Cu_4O_X$ (Y is around 1.5) were measured to be 40°–60° K., which is not so high. Relatively high critical temperatuers were obtained with samples conforming to the stoichiometric formulae $Bi_4Sr_4Ca_2Cu_4O_X$ and $Bi_2Sr_3Ca_2Cu_2O_X$. The number designating the oxygen proportion is 6–10, e.g. around 8.1.

Hereinbefore, the description has been made of the embodiments in which superconducting spirals or helices are formed by eliminating unnecessary intervening portions between adjacent turns of the spirals or helices. However, in accordance with the present invention, superconducting patterns can be produced by introducing one or more elements selected from a group consisting of Mg, Be, Al, Fe, Co, Ni, Cr, Ti, Mn and Zr into unnecessary portions of superconducting thin films by ion implantation in order to modify the portions non-superconducting, so that a superconducting patterns composed of a non-implanted portions remain superconductive. By use of such a method, smooth layered structures can be formed.

While a description has been made for several embodiments, the present invention should be limited only by the appended claims and should not be limited by the particular examles. For example, each spiral or helix may be formed with a metallic spiral or helix by, before or affter forming a superconducting film, forming an underlying or overlying metallic film which is to be processed by laser scribing together with the superconducting film.

I claim:

1. A multilayered circuit comprising:
   a lower superconducting pattern made of a superconducting ceramic material formed on a substrate;
   an intervening insulating ceramic film for electrical isolation formed on said lower superconducting pattern; and
   an upper superconducting pattern made of a superconducting ceramic material electrically isolated from said lower superconducting pattern by said insulating ceramic film wherein the thermal expansion coefficient of the substrate is ±50% that of the superconducting ceramic materials of the lower and upper superconducting patterns.

2. The circuit of claim 1 wherein said lower and upper superconducting patterns are interconnected through an opening formed in said insulating ceramic film.

3. The circuit of claim 1 wherein said lower and/or upper superconducting pattern is a coil.

4. The circuit of claim 3 wherein said lower and upper patterns are coils which are respectively coupled to form a multilayered coil wherein the lower coil turns in a first turning direction from a first end thereof to a second end and the upper coil turns in a second turning direction from a first end thereof to a second end, and wherein said first and second turning directions are opposite one another.

5. The circuit of claim 1 wherein said lower pattern is formed on an insulating ceramic substrate.

6. The circuit of claim 1 wherein said patterns are spirals formed on a disk.

7. The circuit of claim 1 wherein said patterns are helices on a cylindrical surface.

8. The circuit of claim 1 wherein said insulating ceramic film is made of an oxide ceramic material conforming to the stoichiometric formula $[(A'_pA''_{1-p})_{1-x}(B'_qB''_{1-q})_x]_y(Cu_rX_{1-r})_zO_w$, where A' is one or more elements of Group IIIa of the Priodic Table, e.g., the rare earth elements or lantanoides, B' is one or more alkaline earth metals, i.e. Ba, Sr and Ca, A", B" and X are selected from a group consisting of Mg, Be, Al, Fe, Co, Ni, Cr, Ti, Mn and Zr, and X=0-1; Y=2.0-4.0; Z=1.0-4.0; and W=4.0-10.0, and the numbers p, q and r are chosen so that the total proportion of A", B" and X is 1-20 vol %, and wherein said superconducting ceramic pattern is made of materials conforming to the stoichiometric formula, $(A_{1-x}B_x)_yCu_zO_w$, where A is one or more elements of Group IIIa of the Priodic Table, e.g., the rare earth elements or lantanoides, B is one or more alkaline earth metals, i.e. Ba, Sr and Ca, and X=0-1; Y=2.0-4.0; Z=1.0-4.0; and W=4.0-10.0.

9. A multi-layered coil where each layer comprises a copper-oxide superconducting ceramic and where each layer is electrically isolated from adjacent layers by a copper-oxide non-superconducting ceramic layer interposed between said adjacent layers.

10. The multilayered circuit of claim 1, wherein superconducting ceramic materials for the upper and lower superconducting patterns comprise materials represented by the formula $(A_{1-x}B_x)_yCu_zO_w$, wherein A is one or more elements of Group IIIa of the Periodic Table, B is one or more alkaline earth metals, x=0-1, y=2.0-4.0 z=1.0-4.0 and w=4.0-10.0.

11. The multilayered circuit of claim 10, wherein z=1.5-3.5, y=2.5-3.5 and w=6.0-8.0, and wherein B comprises at least one of Ba, Sr and Ca.

12. The multilayered circuit of claim 1, wherein superconducting ceramic materials for the upper and lower superconducting patterns comprises materials represented by the formula $(A_{1-x}B_x)_yCu_zO_w$, wherein A is one or more elements of Group Vb of the Periodic Table, B is one or more elements of Group IIa of the Periodic Table, x=0.3-1, y=2.0-4.0 z=1.0-4.0 and w=4.0-10.0.

13. The multilayered circuit of claim 12, wherein A comprises at least one of B, Sb and As, z=1.5-3.5 y=2.5-3.5, and w=6.0-8.0.

14. The multilayered circuit of claim 1, wherein superconducting materials for the upper and lower superconducting patterns comprise at least one of $BiSrCaCu_2O_x$, $Bi_4Sr_3Ca_3Cu_4O_x$, $Bi_4Sr_4Ca_2Cu_4O_x$ and $Bi_2Sr_3Ca_2Cu_2O_x$.

15. The multilayered coil of claim 9, wherein the copper-oxide superconducting ceramic comprises materials represented by the formula $(A_{1-x}B_x)_yCu_zO_w$, wherein A is one or more elements of Group IIIa of the Periodic Table, B is one or more alkaline earth metals, x=0-1, y=2.0-4.0 z=1.0-4.0 and w=4.0-10.0.

16. The multilayered coil of claim 9, wherein the copper-oxide superconducting ceramic comprises materials represented by the formula $(A_{1-x}B_x)_yCu_zO_w$, wherein A is one or more elements of Group Vb of the Periodic Table, B is one or more elements of Group IIa, x=0.3-1, y=2.0-4.0, z=1.0-4.0 and w=4.0-10.0.

* * * * *